(12) United States Patent
Onodera

(10) Patent No.: US 7,875,510 B2
(45) Date of Patent: Jan. 25, 2011

(54) THIN-FILM DEVICE, METHOD FOR MANUFACTURING THE SAME, AND ELECTRONIC APPARATUS

(75) Inventor: Katsuyoshi Onodera, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/465,828

(22) Filed: May 14, 2009

(65) Prior Publication Data

US 2010/0013063 A1    Jan. 21, 2010

(30) Foreign Application Priority Data

Jul. 17, 2008    (JP) .............................. 2008-185815

(51) Int. Cl.
*H01L 21/84* (2006.01)
(52) U.S. Cl. .................. 438/164; 438/73; 257/437; 257/E21.6; 257/E21.411; 257/E31.001
(58) Field of Classification Search ................ 438/164, 438/24, 73; 257/E21.701, E21.411, E21.6, 257/E21.328
See application file for complete search history.

(56) References Cited

U.S. PATENT DOCUMENTS

2002/0139981 A1   10/2002   Young

2009/0141230 A1 *   6/2009   Inoue et al. ................. 349/158
2010/0090224 A1 *   4/2010   Lee et al. ..................... 257/72
2010/0133546 A1 *   6/2010   Jain ............................ 257/72

FOREIGN PATENT DOCUMENTS

| JP | 10-125929 | 5/1998 |
| JP | 10-125930 | 5/1998 |
| JP | 10-125931 | 5/1998 |
| JP | 2003-069034 | 3/2003 |
| JP | 2004-519866 | 7/2004 |
| JP | 2007-250435 | 9/2007 |

* cited by examiner

*Primary Examiner*—Caridad M Everhart
(74) *Attorney, Agent, or Firm*—AdvantEdge Law Group, LLC

(57) ABSTRACT

A method for manufacturing a thin-film device includes forming a separation layer on a substrate, forming a support layer of mainly clay containing silicate mineral having a layered crystal structure on the separation layer, forming a thin-film functional member on the support layer, applying an energy to the separation layer to reduce the adhesion between the substrate and the support layer, and removing the substrate from the support layer and the thin-film functional member.

8 Claims, 4 Drawing Sheets

THIN-FILM DEVICE, METHOD FOR MANUFACTURING THE SAME, AND ELECTRONIC APPARATUS

BACKGROUND

1. Technical Field

The present invention relates to a thin-film device including a thin-film element, such as a thin-film transistor, or other thin-film functional members, and to an electronic apparatus including the thin-film device.

2. Related Art

Thin-film functional members (multilayer composite), such as semiconductor elements, are often formed by a method using a transfer technique. For example, in the techniques disclosed in JP-A-10-125929, JP-A-10-125930 and JP-A-10-125931, a transfer member to be transferred, such as thin-film transistor, is previously formed on a substrate with a release layer therebetween. The transfer member is bound to another target substrate and is then separated from the original substrate by, for example, light irradiation, thereby being transferred. This technique facilitates the formation of a thin-film element or the like on a substrate onto which the thin-film element or the like is not easily formed directly, such as a plastic substrate or a flexible sheet. The transfer technique is useful in forming a plurality of thin-film elements or thin-film circuits that should be formed under different conditions on a substrate. Such thin-film functional members each can be prepared on a substrate under their optimal conditions separately, and then transferred to a target substrate at one time.

When such a transfer technique is applied to the manufacture of a thin-film device, two-step transfer is required to transfer the original layered structure (order of layers) of a thin-film element on a substrate onto a target substrate. More specifically, for example, a thin-film element formed on an original substrate is transferred onto a temporary substrate. The order of layers of the thin-film element is inverted on the temporary substrate at this time. The thin-film element on the temporary substrate is then transferred onto a target substrate. Thus, the resulting thin-film element on the target substrate has the same order of the layers as the thin-film element on the original substrate.

The increase of the number of transfer steps, however, increases the possibility of transfer failure due to stresses and may result in damaged or broken layered structure. On the other hand, a single-step transfer results in an inverted layered structure on the target substrate undesirably. A novel technique is desired to overcome those disadvantages.

SUMMARY

Accordingly, an advantage of some aspects of the invention is that it overcomes disadvantages of the known art and then provides a flexible thin-film device.

Another advantage is that it overcomes the disadvantages of the known art and provides a method for manufacturing a flexible thin-film device.

According to an aspect of the invention, a method for manufacturing a thin-film device is provided. In the method, a separation layer is formed on a substrate, and a support layer is formed of mainly clay containing silicate mineral having a layered crystal structure on the separation layer. A thin-film functional member is formed on the support layer. An energy applied to the separation layer to reduce the adhesion between the substrate and the support layer, and then the substrate is removed from the support layer and the thin-film functional member.

The thin-film functional member mentioned herein refers to a structure defined by an appropriate combination of an electroconductive layer, a semiconductor layer, an insulating layer and other thin layers. Example of the thin-film functional member include: thin-film elements, such as thin-film transistors and thin-film diodes; thin-film circuits including these thin-film elements; electrodes, such as transparent electrodes made of, for example, ITO or a mesa film; photoelectric transducers used for solar cells or image sensors; memory elements; actuators, such as piezoelectric elements; micromirrors (piezoelectric thin-film ceramics); recording media such as magnetic recording media, magneto-optic recording media and optical recording media; magnetic recording thin-film heads, coils, inductors and highly permeable magnetic materials, and micro-magnetic devices including these elements or materials; optical thin films, such as filters, reflective films, dichroic mirrors and polarizers; semiconductor thin films; superconducting thin films, such as YBCO thin film; magnetic thin films; and multilayer thin films, such as multilayer metal thin films, metal/ceramic thin films, metal/semiconductor thin films, ceramic/semiconductor thin films and other multilayer thin films including an organic thin film and a film made of other materials.

The method produces a flexible thin-film device using a self-supported film mainly made of clay containing silicate mineral having a layered crystal structure as the support. Since this method produces a thin-film device supported on a flexible support without performing the step of transferring a thin-film device temporarily formed on a substrate onto another substrate, there do not occur problems resulting from the increase of the number of transfer steps or the disadvantage that the order of the layers of, for example, the thin-film element is inverted, unlike the known technique.

In the method, preferably, a protective layer may be formed to cover the support layer after the formation of the support layer and before the formation of the thin-film functional member.

Thus, the thin-film functional member is prevented from being contaminated with foreign matter that may be contained in the support layer.

Preferably, the support layer is formed in an inner region apart from the outer edges of the substrate in a plan view, and the protective layer is formed so as to cover the surface of the support layer not in contact with the separation layer and the sides of the support layer.

Since the sides of the support layer are covered with the protective layer, the thin-film functional member is further prevented from being contaminated with foreign matter from the support layer.

The protective layer may include at least one of a silicon oxynitride film and an aluminium oxide film. The protective layer may include a plurality of either film, or both of these films.

Consequently, the protective layer can block foreign matter effectively.

The support layer may be formed by a cast method. Other methods can of course be applied to the formation of the support layer.

The cast method is a simple process to form a flexible support.

According to another aspect of the invention, a thin-film device is provided which includes: (a) a support layer mainly made of clay containing silicate mineral having a layered crystal structure; and (b) a thin-film functional member disposed on the support layer.

The thin-film device can be a flexible device using a self-supported film mainly made of clay containing silicate mineral having a layered crystal structure as the support. This structure does not cause the problem that the order of the layers of, for example, the thin-film element is inverted, unlike the structure formed by the known technique.

A thin-film device according still another aspect of the invention includes: (a) a support layer mainly made of clay containing silicate mineral having a layered crystal structure; and (b) a protective layer covering the support layer; and (c) a thin-film functional member disposed on the support layer.

The thin-film device can be a flexible device using a self-supported film mainly made of clay containing silicate mineral having a layered crystal structure as the support. This structure does not cause the problem that the order of the layers of, for example, the thin-film element is inverted, unlike the structure formed by the known technique. Also, even if the support layer contains some foreign matter, this structure prevents the foreign matter from contaminating the thin-film device, and thus the thin film device is highly reliable.

Preferably, the protective layer covers a surface and the sides of the support layer.

In addition, since the sides of the support layer are covered with the protective layer, the thin-film functional member is further prevented from being contaminated with foreign matter from the support layer.

The protective layer may include at least one of a silicon oxynitride film and an aluminium oxide film. The protective layer may include a plurality of either film, or both of these films.

Consequently, the protective layer can block foreign matter effectively.

According to another aspect of the invention, an electronic apparatus including the thin-film device as described above is provided. The electronic apparatus is not particularly limited as long as it includes a thin-film device, and may include an electro-optic device (for example, electrophoretic device) using the thin-film device as a circuit board.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the invention will now be described with reference to the drawings.

FIGS. 1A to 1D and 2A to 2C are schematic sectional views showing a method for manufacturing a thin-film device according to an embodiment of the invention. For the sake of clearness, some parts in these figures may not be hatched. FIG. 3 is a schematic plan view of a step of the thin-film device manufacturing method.

Figure 1A:
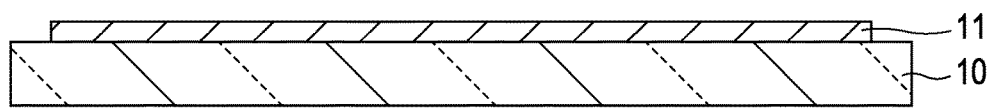
FIGS. 1A to 1D are schematic sectional views showing a method for manufacturing a thin-film device.

First, a separation layer (release layer) 11 is formed on a surface of a substrate 10, as shown in FIG. 1A. In the present embodiment, the separation layer 11 is formed in an inner region apart from the outer edges of the substrate 10, as shown in FIG. 3, in a plan view. However, the separation layer 11 may be formed over the entire surface of the substrate 10.

In the embodiment, the substrate 10 has suitable characteristics (for example, mechanical strength and heat resistance) to form a desired thin-film element, such as a thin-film transistor, and may be made of quartz glass or soda glass. The thickness of the substrate 10 is, for example, about 0.5 to 0.7 mm.

The separation layer 11 causes separation in a layer or at an interface by applying an energy produced by, for example, light irradiation, and is made of amorphous silicon (a-Si) of, for example, about 100 nm in thickness. Preferably, the amorphous silicon contains hydrogen to some extent. Various films made of other materials may be used as the separation layer 11 (see the above-cited JP-A-10-125929, JP-A-10-125930 and JP-A-10-125931).

Figure 1B:
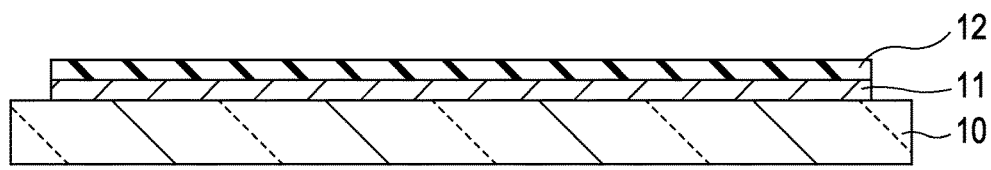

A support layer 12 intended for a support of the thin-film device is formed on the separation layer 11 on the substrate 10, as shown in FIG. 1B. The support layer 12 is preferably formed in an inner region apart from the outer edges of the substrate 10, as shown in FIG. 3, in a plan view. The reason will be described later. The separation layer 11 in the present embodiment is formed in an inner region apart from the outer edges of the substrate 10 in a plan view, as described above, and the support layer 12 is formed along the surface of the separation layer 11. The support layer 12 may be formed over the entire surface of the substrate 10.

The support layer 12 used in the present embodiment is a film made of mainly clay containing silicate mineral having a layered crystal structure. Such a film can be formed by, for example, the cast method. In the cast method, a solution is applied onto a substrate, and the solvent is evaporated to form a film. The resulting film can be used as a self-supported film, and is hence suitable as the support of the thin-film device. Also, this film is resistant to the process temperature (for example, about 400° C.) at which the thin-film element is formed. The film has a thermal expansion coefficient on the order of $10^{-6}$, which is the same order as the thermal expansion coefficient of the glass substrate suitably used as the substrate 10. Hence, the support layer 12 is resistant to thermal stress produced during the formation of the thin-film element. The film of the support layer 12 can be formed to several micrometers to several hundred meters, and is thus flexible. Furthermore, the film is insulative and superior in air and liquid barrier properties.

Figure 1C:
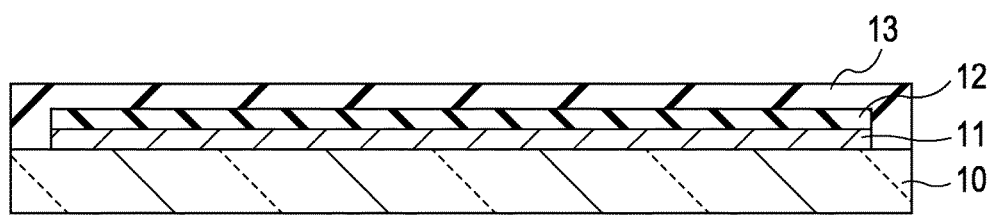

The support layer 12 is subsequently coated with a protective layer 13, as shown in FIG. 1C. In the present embodiment, the protective layer 13 covers the surface of the support layer 12 not in contact with the separation layer 11 and further the sides of the support layer 12. In the embodiment shown in FIG. 1C, the protective layer 13 also covers the sides of the separation layer 11. Since the support layer 12 is disposed in an inner region apart from the outer edges of the substrate 10, as described above, the protective layer 13 can be easily formed so as to cover the sides of the support layer 12.

Desirably, the protective layer 13 is made of a material capable of preventing the permeation of sodium or the like that may be contained in the support layer 12. For example, inorganic films may be used, such as of silicon oxynitride (SiON) and aluminium oxide ($AlO_x$). The protective layer 13 may include both of these films or a plurality of either film. Each layer of the protective layer 13 may be formed by physical vapor deposition, such as sputtering or deposition.

Figure 1D:
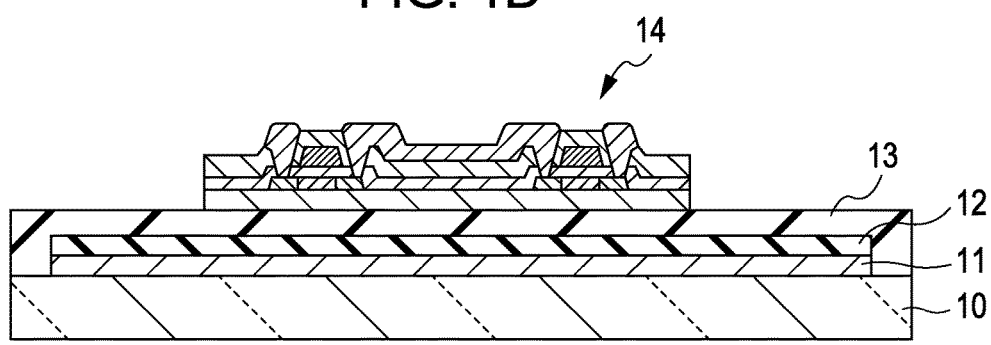

For the next step, a thin-film circuit (thin-film functional member) 14 having a desired function is formed on the protective layer 13, as shown in FIG. 1D. The thin-film circuit 14 may be a thin-film element, such as a thin-film transistor, as shown in the figure, or a circuit including wires. Since the thin-film circuit 14 can be prepared by a known technique, the description of its preparation is omitted. The thin-film circuit used in the present embodiment includes a pixel circuit and a driving circuit for an electrophoretic device.

Figure 2A:
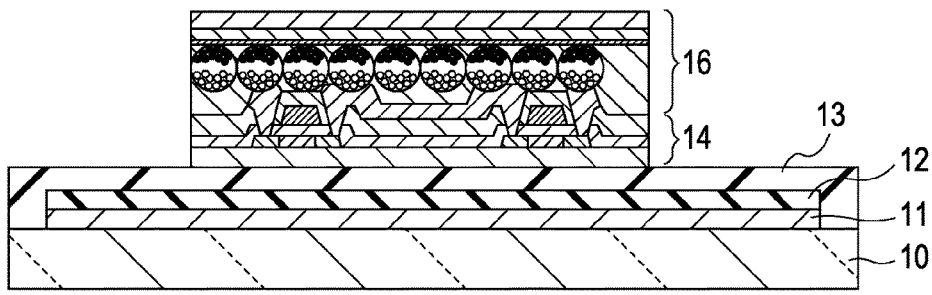
FIGS. 2A to 2C are schematic sectional views showing the method for manufacturing a thin-film device.
Figure 3:
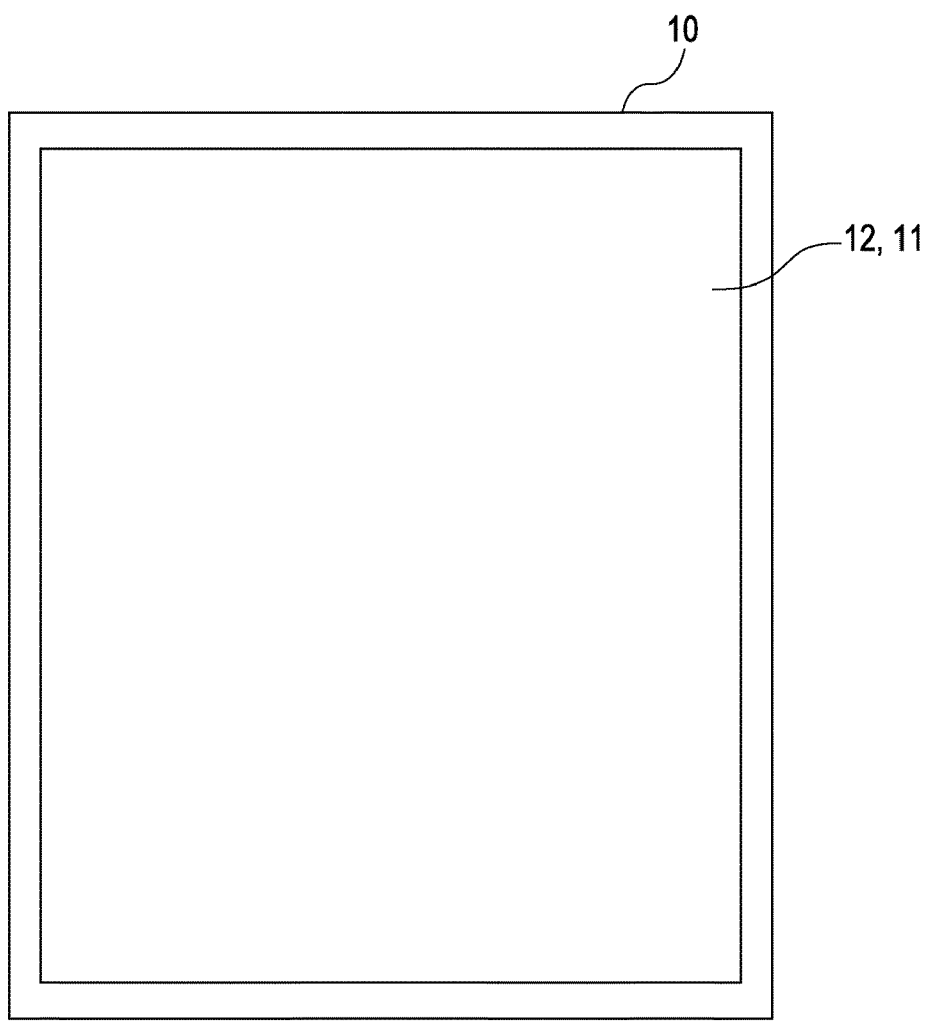
FIG. 3 is a schematic plan view showing the method for manufacturing a thin-film device.

Then, an electrophoretic sheet 16 is formed on the thin-film circuit 14, as shown in FIG. 2A. The electrophoretic sheet 16 includes an electrophoretic layer and a protective member. The thin-film circuit 14 and the electrophoretic sheet 16 define an electrophoretic device. The electrophoretic device is an example of the thin-film device.

Figure 2B:
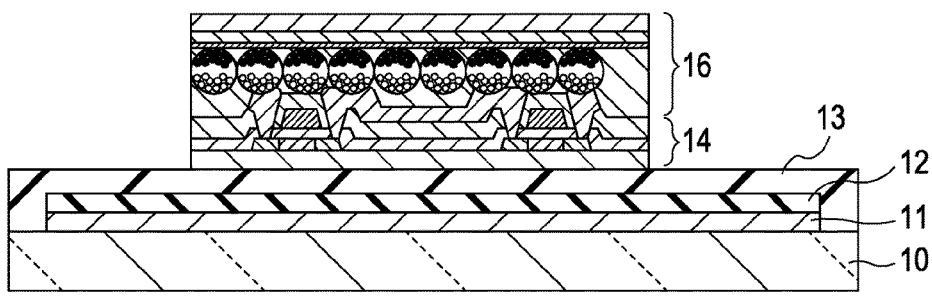
Figure 2B:
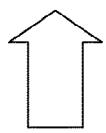
Figure 2B:
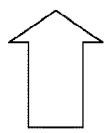
Figure 2B:
Figure 2C:
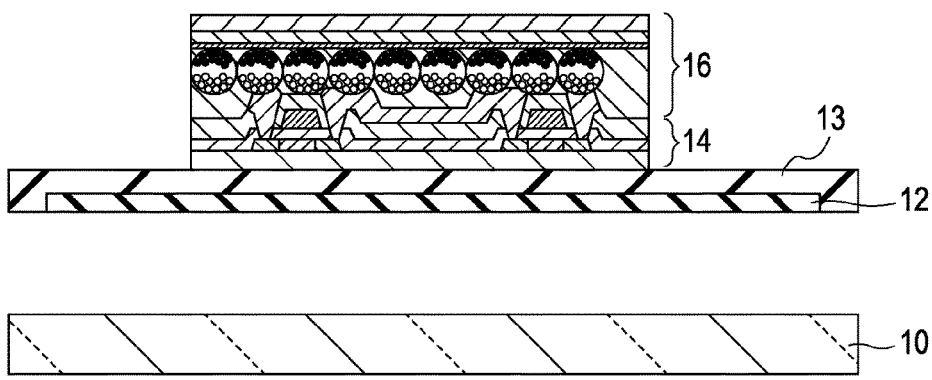

In the next step, an energy is applied to the separation layer 11, as shown in FIG. 2B, so that separation occurs at or in the separation layer 11. The energy is applied to the separation layer 11 through the substrate 10 by emitting laser light. Therefore, the substrate 10 is transmissive to the laser light used for separation of the separation layer. Preferably, the laser light has a wavelength of 308 nm and is emitted from, for example, a XeCl excimer laser. The irradiation with the laser light causes ablation of the separation layer 11 of amorphous silicon to reduce the adhesion of the separation layer 11. Then, the support layer 12 and other layers are removed from the substrate 10, as shown in FIG. 2C. Thus, a thin-film device is completed which includes the protective layer 13, the thin-film circuit 14, the electrophoretic sheet 16, and the support layer 12 supported these parts.

Exemplary electronic apparatuses including the above-described electrophoretic device will now be described.

Figure 4A:
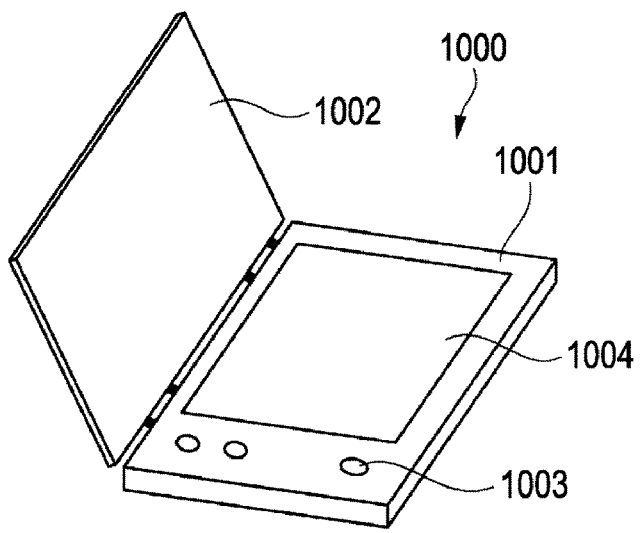
FIGS. 4A to 4C are schematic perspective views of electronic apparatuses.
Figure 4B:
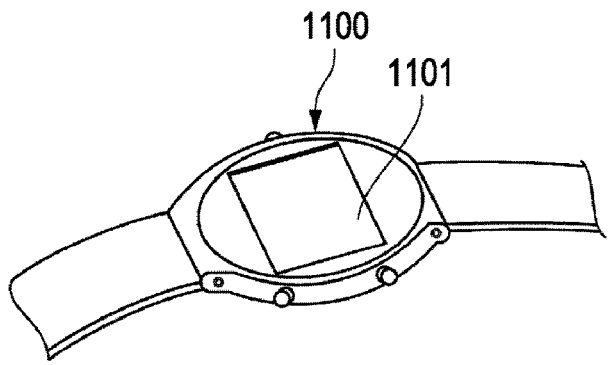
Figure 4C:
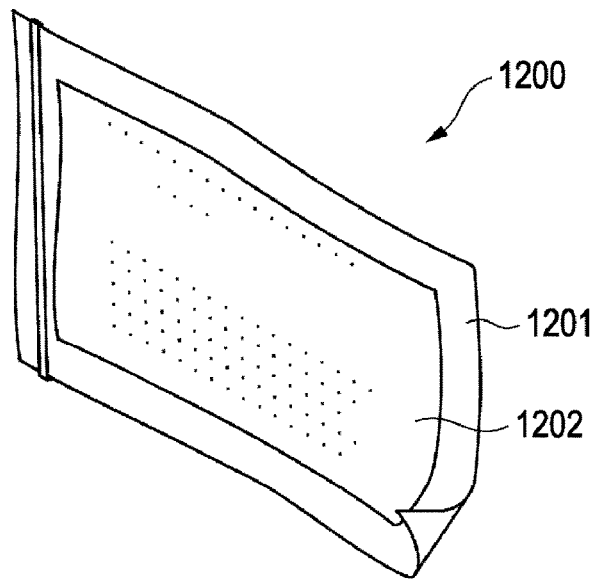

FIGS. 4A to 4C are perspective views of electronic apparatuses including the electrophoretic device. FIG. 4A is a perspective view of an electronic book, which is one type of the electronic apparatus. The electronic book 1000 includes a book-like frame 1001, a cover 1002 capable of opening and closing the frame 1001, a control section 1003, and a display section 1004 including the electrophoretic device of the above-described embodiment. FIG. 4B is a perspective view of a wristwatch, which is one type of the electronic apparatus. The wristwatch 1100 includes a display section 1101 including the electrophoretic device of the embodiment. FIG. 4C is a perspective view of an electronic paper, which is one type of the electronic apparatus. The electronic paper 1200 includes a body 1201 including a rewritable sheet having the same texture and flexibility as paper, and a display section 1202 including the electrophoretic device of the embodiment. The electrophoretic device can be applied to other electronic apparatuses using visual color tone changes caused by the migration of electrophoretic particles without limiting to the above apparatuses. For example, the electrophoretic device can be applied to walls formed by boding electrophoretic films and other components of real estate or of movables, such as vehicles, planes and ships.

According to the above-described embodiment, a flexible thin-film device is provided which uses a self-supported film mainly made of clay containing silicate mineral having a layered crystal structure as the support. Unlike the known technique, the method of the embodiment prevents the inversion of the order of the layers in the layered structure of the thin-film element or the like.

Also, even if the support layer contains some foreign matter, the method of the embodiment prevents the foreign matter from contaminating the thin-film device, consequently providing reliable thin-film devices.

In addition, since the sides of the support layer are covered with the protective layer, the thin-film functional member is further prevented from being contaminated with foreign matter from the support layer.

The invention is not limited to the above-described embodiment, and various modifications may be made without departing from the spirit and scope of the invention.

For example, although the embodiment uses a thin-film transistor as the thin-film functional member, the thin-film functional member is not limited to the thin-film transistor.

While the invention has been described with reference to the above embodiment using an electrophoretic device as an thin-film device, the invention can be applied to various types of device including liquid crystal devices, electroluminescent devices and electro-optic devices.

The materials, thicknesses and methods for forming the elements or members used in the above embodiment are just examples, and are not limited by the above description.

The entire disclosure of Japanese Patent Application No. 2008-185815, filed Jul. 17, 2008 is expressly incorporated by reference herein.

What is claimed is:

1. A method for manufacturing a thin-film device, comprising:
    forming a separation layer on a substrate;
    forming a support layer of mainly clay containing silicate mineral having a layered crystal structure on the separation layer;
    forming a thin-film functional member on the support layer;
    applying an energy to the separation layer to reduce the adhesion between the substrate and the support layer; and
    removing the substrate from the support layer and the thin-film functional member.

2. The method according to claim 1, wherein the support layer is formed by a cast method.

3. The method according to claim 1, further comprising forming a protective layer to cover the support layer after forming the support layer and before forming the thin-film functional member.

4. The method according to claim 3, wherein the support layer is formed in an inner region part from the outer edges of the substrate in a plan view, and the protective layer is formed so as to cover the surface of the support layer not in contact with the separation layer and the sides of the support layer.

5. The method according to claim 3, wherein the protective layer includes at least one of a silicon oxynitride film and an aluminium oxide film.

6. A thin-film device comprising:
    a support layer mainly made of clay containing silicate mineral having a layered crystal structure;
    a protective layer covering the support layer, the protective layer covering a surface and sides of the support layer; and
    a thin-film functional member disposed on the protective layer.

7. The thin-film device according to claim 6, wherein the protective layer includes at least one of a silicon oxynitride film and an aluminium oxide film.

8. An electronic apparatus comprising the thin-film device as set forth in claim 6.

* * * * *